(12) United States Patent
Guthrie

(10) Patent No.: US 6,359,509 B1
(45) Date of Patent: Mar. 19, 2002

(54) BALANCED ERROR CORRECTION AMPLIFIER AND METHOD OF REMOVING DISTORTION FROM AN AMPLIFIED SIGNAL

(75) Inventor: Warren Guthrie, West Olive, MI (US)

(73) Assignee: Netcom, Inc., Wheeling, IL (US)

( * ) Notice: Subject to any disclaimer, the term of this patent is extended or adjusted under 35 U.S.C. 154(b) by 0 days.

(21) Appl. No.: 09/557,904

(22) Filed: Apr. 21, 2000

Related U.S. Application Data

(60) Provisional application No. 60/131,484, filed on Apr. 29, 1999.

(51) Int. Cl.[7] .............................. H03F 1/00; H03F 1/26
(52) U.S. Cl. ........................................ 330/151; 330/149
(58) Field of Search ................................. 330/149, 151

(56) References Cited

U.S. PATENT DOCUMENTS

| | | |
|---|---|---|
| 3,906,401 A | 9/1975 | Seidel |
| 4,379,994 A | 4/1983 | Bauman |
| 4,583,049 A | 4/1986 | Powell |
| 4,591,800 A | 5/1986 | Opas |
| 4,595,882 A | 6/1986 | Silagi et al. |
| 4,629,996 A | 12/1986 | Watanabe et al. |
| 4,879,519 A | 11/1989 | Myer |
| 4,926,136 A | 5/1990 | Olver |
| 5,077,532 A | 12/1991 | Obermann et al. |
| 5,157,345 A | 10/1992 | Kenington et al. |
| 5,304,945 A | 4/1994 | Myer |
| 5,376,899 A | 12/1994 | Pass |
| 5,444,418 A | 8/1995 | Mitzlaff |
| 5,485,120 A | 1/1996 | Anvari |
| 5,570,063 A | 10/1996 | Eisenberg |
| 5,594,385 A | 1/1997 | Anvari |
| 5,619,168 A | 4/1997 | Myer |
| 5,623,227 A | 4/1997 | Everline et al. |
| 5,675,288 A | 10/1997 | Peyrotte et al. |
| 5,757,231 A | 5/1998 | Tozawa |
| 5,760,646 A | 6/1998 | Belcher et al. |
| 5,838,195 A | 11/1998 | Szmurlo et al. |
| 5,867,064 A | 2/1999 | Van Horn et al. |
| 5,874,856 A | 2/1999 | Van Horn |
| 5,912,586 A | 6/1999 | Mitzlaff |
| 5,917,375 A | 6/1999 | Lisco et al. |
| 5,963,091 A | 10/1999 | Chen et al. |
| 5,977,825 A | 11/1999 | Mueck |
| 5,977,826 A | 11/1999 | Behan et al. |

FOREIGN PATENT DOCUMENTS

| | | |
|---|---|---|
| EP | 1 030 441 A2 | 8/2000 |

*Primary Examiner*—Benny Lee
*Assistant Examiner*—Patricia T. Nguyen
(74) *Attorney, Agent, or Firm*—Michael Best & Friedrich LLP

(57) ABSTRACT

An error correction amplifier and method of canceling distortion in an amplified signal. The error correction amplifier includes a main amplifier operable to receive a main input signal and generate an amplified signal having a main component and an error component. The error correction amplifier also includes a second amplifier coupled in a feed-forward arrangement to the main amplifier and operable to receive an input signal and to generate an output signal having a main component and an error component. A balancing network is coupled to the main amplifier and to the second amplifier. The balancing network isolates a sample of the output signal of the main amplifier, inverts the sample, and combines the sample with the input signal to the second amplifier. A summing point combines the output signal from the main amplifier and the output signal of the second amplifier such that the error components of the two output signals substantially cancel one another and the main components of the output signals are added to one another. The method involves providing a first signal path with a gain and a phase, providing a second signal path that is 180° out-of-phase to the first signal path and that has a gain that is about two times greater than the gain of the first signal path, providing a third signal path with a gain and a phase, and providing a fourth signal path that has a gain and a phase that are substantially the same as the gain and the phase of the third signal path.

31 Claims, 5 Drawing Sheets

BALANCED ERROR CORRECTION AMPLIFIER AND METHOD OF REMOVING DISTORTION FROM AN AMPLIFIED SIGNAL

RELATED APPLICATIONS

This application claims the benefit of prior filed co-pending provisional patent application No. 60/131,484 filed on Apr. 29, 1999.

BACKGROUND OF THE INVENTION

The present invention relates to distortion or error canceling amplifiers. More particularly, the invention relates to a distortion-canceling amplifier that has low spectral regrowth and enhanced power efficiency.

Modern digital communications systems provide high spectral efficiency, clarity, and fade resistance that is unmatched by older analog systems. Nevertheless, increasing consumer demand requires even better systems. To achieve further improvements in performance, communications systems such as CDMA (code division multiple access) and GSM (global system for mobile communication) will require amplifiers that provide relatively high-power signals with limited or minimal spectral regrowth. As is known, spectral regrowth refers to the amplification of signals outside a desired frequency range. Ideally, an amplifier would amplify signals without creating noise, particularly noise outside the frequency range of the input signal. In practice, this ideal has not yet been achieved, and spectral regrowth often causes interference between adjacent communication channels. Limiting or reducing spectral regrowth is an important factor to improving spectral efficiency. When spectral regrowth is low, interference is reduced. With reduced interference, channel separation may be narrowed and the number of channels in a given bandwidth may be increased.

Simple class A or class AB amplifiers have been used in communications applications. When using a class A or class AB amplifier, spectral regrowth can be controlled by operating a simple amplifier at 8 to 10 dB below compression (the point where the amplifier clips or saturates). However, simple class A and class AB amplifiers waste about 90% of the available output power.

Another type of amplifier, a feed-forward amplifier, can be operated at higher power levels with higher efficiency. Feed-forward amplifiers ("FFAs") use two amplifiers: a main amplifier and a distortion-canceling amplifier. The main amplifier is operated at a relatively high power level and generates an amplified, but distorted or noisy signal. A feed-forward circuit or path is used to estimate the distortion generated by the main amplifier. The estimated distortion is inverted, amplified, and then summed with the output from the main amplifier to remove the distortion in the amplified signal. An exemplary feed-forward amplifier 10 is shown in FIG. 1.

The amplifier 10 receives an input signal 12. The input signal 12 is delivered to a coupler 14. The coupler 14 outputs a signal 16 to a gain and phase block 18. The output of the gain and phase block 18 is delivered to a main amplifier 20, which could be a class A or class AB amplifier. The main amplifier 20 amplifies the input signal 12 by a predetermined gain and outputs an amplified signal 21 to a coupler 22. The amplified signal 21 includes a main signal component (the amplified input signal 12) and a noise or error component. The gain and phase control block 18 and main amplifier 20 comprise a main signal path 24.

The coupler 14 outputs a second signal 26 that is delivered to a delay 28. The amount of time delay presented by the delay 28 is approximately equal to the time required for the signal 16 to propagate through the main signal path 24. The delayed output signal of the delay 28 is delivered to a coupler 30. The coupler 30 also receives an input from the coupler 22. Each signal entering the coupler 30 is phased such that the main signal component in each input signal is canceled (or nearly canceled), leaving only an error signal 31 (the distortion created by the main amplifier 20). The coupler 30 outputs the error signal to an error path 32 that includes a gain and phase block 34 and an error or distortion canceling amplifier 36. The error path 32 generates a second error signal 38. The second error signal 38 is a gain and phase adjusted version of the signal 31. At the output, the amplitude of the second signal 38 matches or nearly matches the amplitude of the error component of the signal 21. Also, the second signal 38 is 180° out-of-phase with the en-or component of the signal 21.

The signal 21 is output by the coupler 22 to an error delay 40. The error delay 40 provides a time delay approximately equal to the time it takes for the error signal 31 to propagate through the error path 32. The delayed signal from the error delay 40 and the error signal 38 are input to a coupler 42. The two signals are combined in the coupler 42 and, due to the phase and gain adjustments made to each, the error signal 38 substantially cancels the error component of the signal 21, creating an output signal 44 with only the main component of the original input signal 12.

While FFAs provide improved amplification over simple amplifiers, FFAs are still relatively inefficient. Loses in the final coupler (e.g., coupler 42) of an FFA waste a large amount of the error signal. In addition, the distortion amplifier in an FFA requires a relatively high power output capability to prevent the error amplifier from creating a significant level of independent distortion. Accordingly, there is a need for improved methods and amplifiers for amplifying communications signals.

SUMMARY OF THE INVENTION

The present invention provides a highly efficient, linear amplifier for communications and other applications in the form of a balanced error correction ("BEC") amplifier. (Sometimes "error correction" and "error cancellation" will be used interchangeably herein.) The BEC amplifier includes a main amplifier operable to receive a main signal and to generate an amplified signal having a main component and an error component. The BEC amplifier also includes a second amplifier coupled in a feed-forward arrangement to the main amplifier and operable to receive an input signal and to generate an output signal having a main component and an error component. A balancing network is coupled to the main amplifier and to the second amplifier. The balancing network isolates a sample of the error component of the output signal of the main amplifier, inverts the sample, and combines the sample with the input signal to the error correction amplifier. A summing point combines the output signal from the main amplifier and the output signal of the error correction amplifier such that the error components of the two output signals substantially cancel one another and the main components of the output signals are added to one another.

The invention also provides a method of providing a first signal path with a gain and a phase, providing a second signal path that is 180° out-of-phase to the first signal path and that has a gain that is about two times greater than the gain of the first signal path, providing a third signal path with a gain and a phase, and providing a fourth signal path that has a gain and phase that is substantially the same as the gain and phase of the third path. The method may also include providing a fifth signal path having a gain and a phase, and providing a sixth signal path that is 180° out-of-phase to the fifth signal path and that has a gain of about 1.5 times the gain of the fifth signal path.

Because the amplifier and method produce an output signal having a high power level and little or no noise component, spectral regrowth, which is typically analyzed based on the power level of a signal within a desired bandwidth as compared to the power level of signals outside the desired bandwidth, is reduced.

As is apparent from the above, it is an advantage of the present invention to provide an efficient amplifier with improved spectral regrowth. Other features and advantages of the present invention will become apparent by consideration of the detailed description and accompanying drawings.

DETAILED DESCRIPTION

Figure 1:
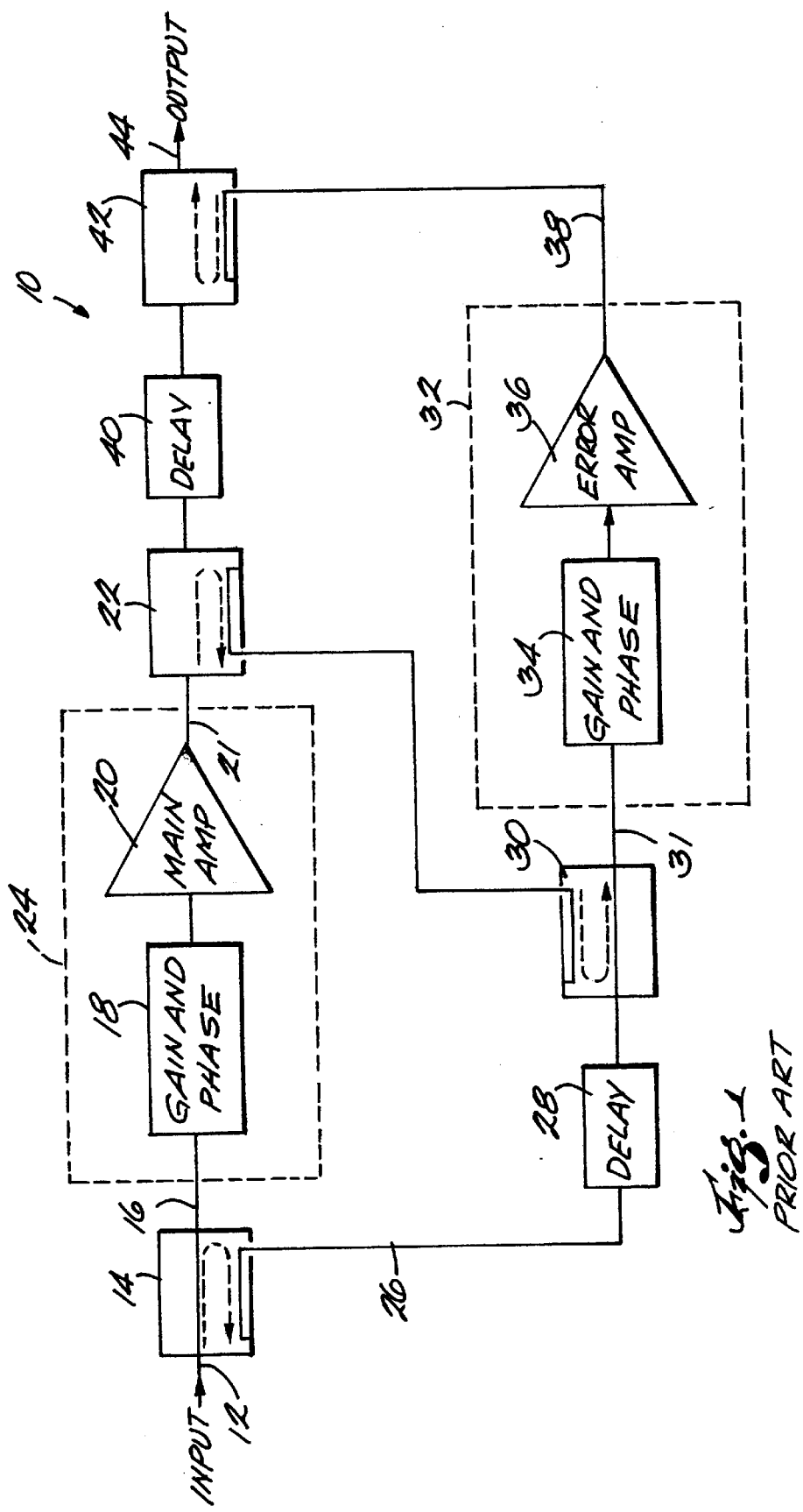
FIG. 1 is a circuit diagram of a feed-forward amplifier ("FFA") of the prior art.

Before one embodiment of the invention is explained in detail, it is to be understood that the invention is not limited in its application to the details of the construction and the arrangements of the components set forth in the following description or illustrated in the drawings. The invention is capable of other embodiments and of being practiced or being carried out in various ways. Also, it is to be understood that the phraseology and terminology used herein is for the purpose of description and should not be regarded as limiting. In particular, it should be understood that the present invention is not limited to applications in communications, but may be used in a wide variety of applications where amplifiers are needed.

Figure 2:
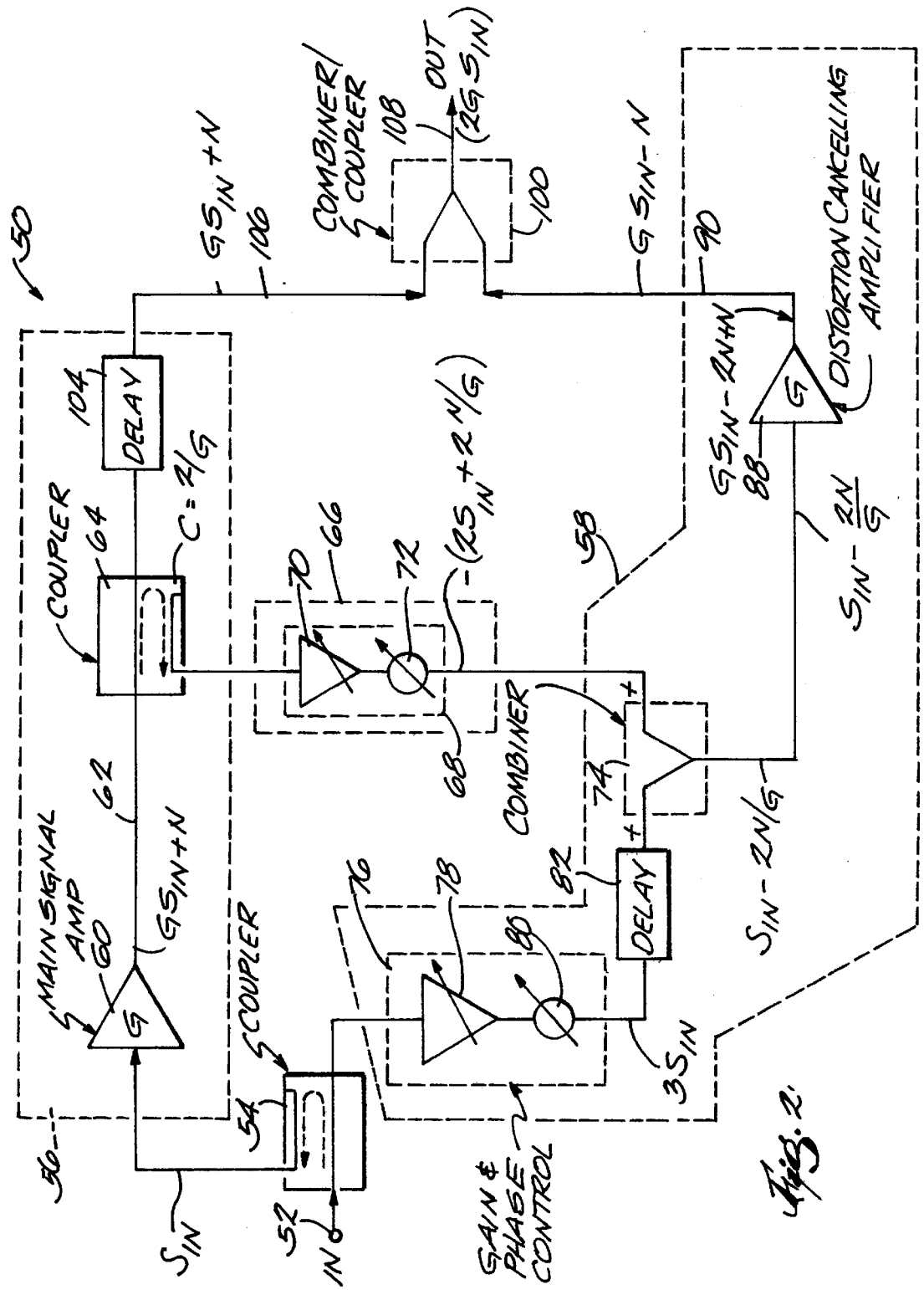
FIG. 2 is a circuit diagram of a balanced error correction ("BEC") amplifier embodying the invention.

FIG. 2 illustrates a BEC amplifier 50 embodying the invention. The BEC amplifier 50 receives an input signal IN at an input node 52. The input signal IN is split by a coupler 54 causing the input signal IN to be directed to a main path 56 and an error path 58. A signal $S_{IN}$ is directed to the main path 56 and is amplified by a main amplifier 60 having a gain G. The main amplifier 60 generates an amplified signal 62 having a main component ($GS_{IN}$) and an error or noise component (N). The amplified signal 62 is split by a coupler 64 that causes part of the amplified signal to be diverted down a feed-forward path 66 to a gain and phase control block or assembly 68. The coupler 64 has a coupling coefficient C of 2/G. The gain and phase control assembly 68 includes a gain control amplifier 70 having an adjustable gain. The gain and phase control assembly 68 also has a phase adjuster 72 that provides phase adjustment to compensate for variations in the components used in the BEC amplifier 50. Preferably, the gain and phase control assembly 68 is adjusted so as to produce an output signal of $-(2S_{IN}+2N/G)$. This output signal is delivered to a combiner 74.

The signal from the coupler 54 that is directed to the error path 58 is gain and phase adjusted by a gain and phase control block or assembly 76. The gain and phase control assembly 76 has a gain control amplifier 78 having an adjustable gain. The gain and phase control assembly 76 also has a phase adjuster 80 that provides phase adjustment to the signal in the error path 58 to compensate for variations inherent in the components used in the BEC amplifier 50. Preferably, the gain and phase control assembly 76 is adjusted so as to produce an output signal of $3S_{IN}$.

The output from the gain and phase control assembly 76 is delivered to a delay 82 that provides a time delay approximately equal to the amount of time required for a signal to propagate through the main amplifier 60. The output of the delay 82 is delivered to the combiner 74. The combiner 74 adds the signal from the gain and phase control assembly 68 to the output signal of the gain and phase assembly 76. The signal exiting the combiner 74 is input to an error or distortion canceling amplifier 88 having a gain G. The distortion canceling amplifier 88 generates a signal 90 having a main component ($GS_{IN}$) and a noise component ($-2N+N=-N$). The signal 90 is input into a summing point or combiner 100.

As noted above, the coupler 64 splits the amplified signal 62 such that part of the amplified signal 62 is diverted down the feed-forward path 66. Another part of the amplified signal 62 is directed to a delay 104. The delay 104 provides a time delay equal to the time required for a signal to propagate through the distortion-canceling amplifier 88. A signal 106 having a main component ($GS_{IN}$) and an error or noise component (N) exits the delay 104 and is directed to the combiner 100.

The signal 90 and the signal 106 are delivered to the combiner 100 and are combined such that their error components substantially cancel each other (N−N=0) and their main components are summed together ($GS_{IN}+GS_{IN}=2GS_{IN}$). The resultant output signal 108 has about twice the power of either the amplified signal 62 or the signal 90.

Figure 7:
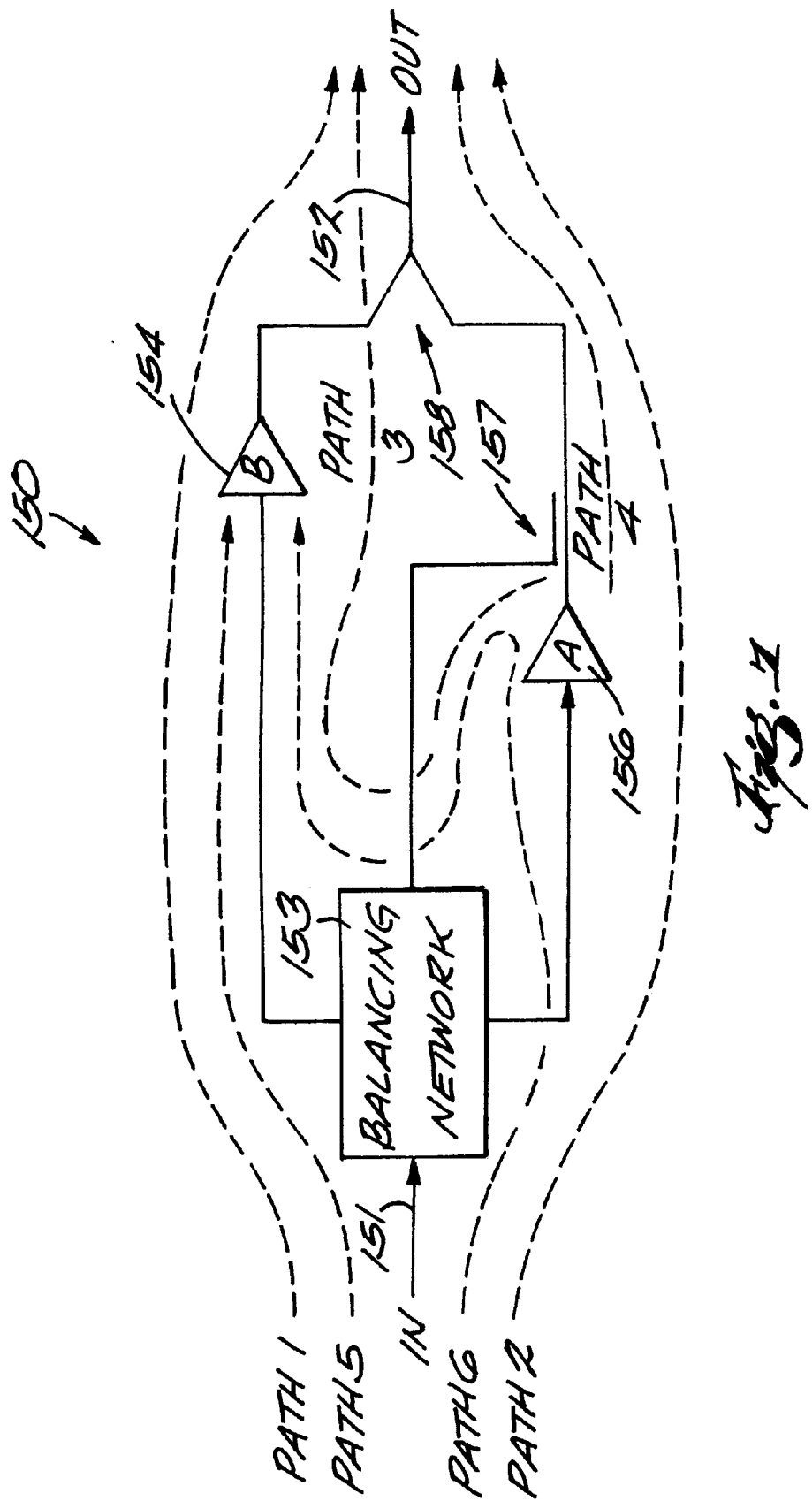
FIG. 7 is a schematic diagram of a BEC amplifier illustrating its signal paths.

The operating principles of a BEC amplifier, such as the BEC amplifier 50, may be more generally explained in terms of the current-path and balancing-network requirements of a more generalized form of a BEC amplifier. FIG. 7 illustrates a generalized BEC amplifier 150. The BEC amplifier 150 includes an input node 151, an output node 152, and a balancing network 153 that provides phase and gain adjustments to various signals propagated through the BEC amplifier 150. Depending on the exact implementation used for a particular application, the balancing network 150 may be implemented with one or more phase control components or assemblies, one or more gain control components or assemblies, and at least one coupler. The amplifier 150 also includes an error or distortion-canceling amplifier 154, a main amplifier 156, a distortion sampling coupler 157, and a summing point 158. The amplifier 150 has six signal paths: PATH 1, PATH 2, PATH 3, PATH 4, PATH 5, and PATH 6.

PATH 1 runs from the input node 151 to the balancing network 153 to the error-canceling amplifier 154 to the output node 152. PATH 2 runs from the input node 151 to the balancing network 153 to the main amplifier 156 to the output node 152. PATH 3 runs from the output of the main amplifier 156 to the balancing network to the error-canceling amplifier 154 to the output node 152. PATH 4 runs from the output of the main amplifier to the output node 152. PATH S runs from the input node 151 to the balancing network 153 to the error-canceling amplifier 154. PATH 6 runs from the input node 151 to the main amplifier 156 to the balancing network 153 to the error-canceling amplifier 156.

The BEC amplifier 150 sums equal-phase output signals from the main and error-canceling amplifiers to obtain a final output. The signal from the distortion-canceling amplifier 152 contains an error component that cancels the distortion produced by both amplifiers. Optimal performance is obtained when the amplifiers 154 and 156 produce the same amount of distortion. The amount of distortion produced by each amplifier 154 and 156 depends on the input signal applied to each. By balancing the amplitude of the applied input signals, the distortion levels of the amplifiers may be controlled such that each amplifier produces the same or substantially the same amount of distortion.

To balance the signals applied to the amplifiers 154 and 156, the signal paths must be configured to meet certain gain and phase requirements. In particular, PATH 3 and PATH 4 are 180° out-of-phase and PATH 3 has a gain that is about 6 dB (or two times) greater than the gain of PATH 4. This signal path topology provides a negative distortion-canceling signal at the output node 152 that is twice the amplitude of the distortion component of the positive output signal of the error-canceling amplifier 154. The double-amplitude, negative distortion-canceling signal is used to cancel the distortion created by the error-canceling amplifier 154 and the amplifier 156.

PATH 1 and PATH 2 are matched in phase and gain to achieve maximum vector addition of the main components of the output signals from the amplifiers 154 and 156 at the summing point 158. PATH 5 and PATH 6 are 180° out-of-phase and PATH 5 has a gain that is about 3.5 dB (1.5 times) greater that the gain of PATH 6. This topology provides input to the error-canceling amplifier 154 that includes an antipodal, diametric (or negative) distortion-canceling component and a reinforcing main signal component.

In addition to the signal path requirements noted above, coupling losses should also be considered to maximize the output power of the amplifier 150. Generally, maximum power output is achieved when there are low or minimal losses in the summing point 158 and a low or minimal loss in the distortion sampling coupler 157. Assuming that the first requirement for a BEC is met, that is, PATH 3 is 6dB greater in gain and 180° out-of-phase from PATH 4, the coupling coefficient of the error sampling coupler 157 may be determined as:

$$L_C = G_{EA} - L_S - L_4 + L_3 - 6dB,$$

where $L_C$ is the coupling coefficient of coupler 157, $G_{EA}$ is the gain of the distortion-canceling amplifier, $L_S$ is the loss in a summing coupler (not shown in FIG. 7, but which corresponds to combiner 74) in the balancing network that sums the distortion sample and a portion of the input signal to provide an input to the amplifier 154, $L_4$ is the loss from the main amplifier 156 to the output node 152, and $L_3$ is the loss from the main amplifier 156 to the output node 152. For a BEC amplifier where $G_{EA}$ is 30dB, all components are ideal (lossless), and the summing coupler is a 3dB combiner, the distortion sampling coupler coefficient $L_C$ is 21dB. This relatively high coefficient results in a relatively low loss in PATH 4.

Optimal operation of a BEC amplifier also requires consideration of delay in the signal path and coupling losses in the input coupler (not shown, but which corresponds to the coupler 54) in the balancing network 153. Matching delay to within 0.2 nsecs in PATH 3 and PATH 4 results in a relatively small error of about 1.4° over a 20MHz frequency band. Matching the delay or minimizing the Δ delay in PATH 3 and PATH 4 while simultaneously meeting the requirement that PATH 5 have a gain about 1.5 times greater than the gain of and be 180° out-of-phase with PATH 6 can only occur if the phase and group delay from the input node 151 to the output of the summing node (e.g., combiner 74) equals the delay from the input node 151 to the output of the main amplifier 156, and the phase and group delay from the input node 151 to the output of the main amplifier 156 equals the delay from the output of the summing node to the output node 152. Therefore, the balancing network should be configured such that the requirements of PATH 3 and PATH 4 are established and then the requirements of PATH 1 and PATH 2 are established.

The gains in PATH 1 and PATH 2 may be equalized by selecting an input coupler (e.g., coupler 54) with appropriate characteristics. Assuming that the summing node (e.g., combiner 74) causes a loss of about 9.54 dB, then the coefficient of the input coupler may be determined according to:

$$L_{IC} = -L_S - L_2 + L_1 - 9.54dB$$

where $L_{IC}$ is the coupling coefficient of the input coupler, $L_S$ is the loss in the summing node or coupler, $L_1$ is the total loss in PATH 1, and $L_2$ is the total loss in PATH 2. In an idealized situation where all components are lossless, and the summing coupler is a 3dB combiner, then $L_{IC}$ is 12.54dB.

Figure 3:
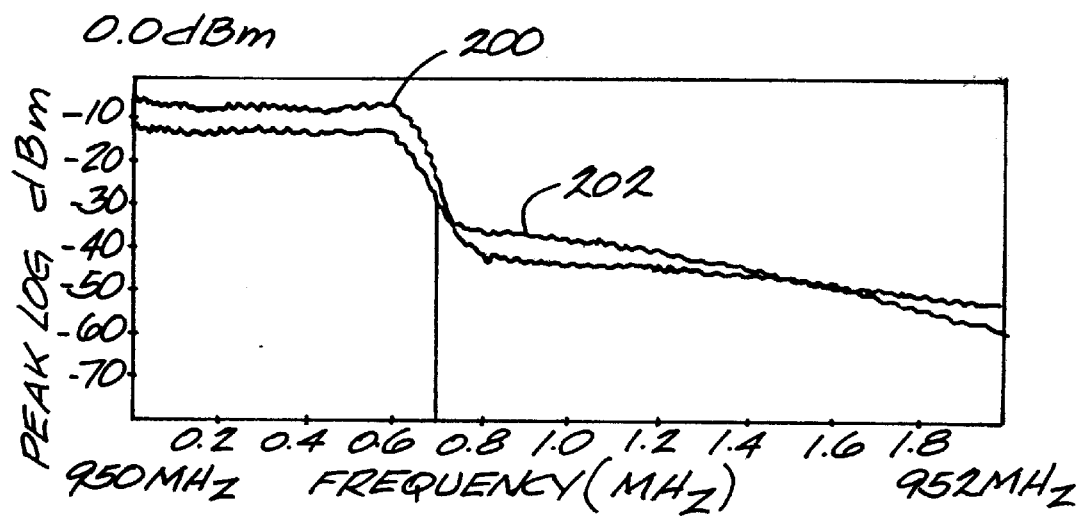
FIG. 3 is a spectral analysis graph of power versus frequency for a BEC amplifier operating near a regrowth specification limit for CDMA communications and includes a second trace where cancellation in the BEC amplifier was turned off.

The advantages of the BEC amplifier topology are best appreciated by reference to FIGS. 3–6, which illustrate the spectral analysis (power vs. frequency) of comparable feed-forward and BEC amplifiers. FIG. 3 illustrates the spectral analysis of a BEC amplifier amplifying a wireless communication signal with a desired channel bandwidth of 1.25 MHz operating in the frequency range of 949.375 MHz to 950.625 MHz. For purposes of illustration, only one half of the channel bandwidth is shown. Ideally, the spectral analysis would show a high power level in the channel and an extremely low or zero power level outside of the channel (i.e., there would be no spectral regrowth). As is known, modern communications specifications define in-band channels (e.g., the 1.25 MHz channel described above) with an allowance for noise or other extraneous signals in a transition band directly outside of the in-band channel. Generally, the power level outside the transition band must be significantly lower (−42 dB for CDMA telephone communications, for example) than the power level within the in-band channel.

The spectral analysis of FIG. 3 includes a first trace 200 and a second trace 202. The first trace 200 represents the spectral performance of a BEC amplifier operating according to the teachings set forth herein. The second trace 202 represents the operation of a BEC amplifier when error cancellation through an error-canceling amplifier is turned off. The spectral regrowth of the trace 200 is significantly lower than that exhibited by the trace 202 (as might best be appreciated by mentally superimposing the two traces).

Figure 4:
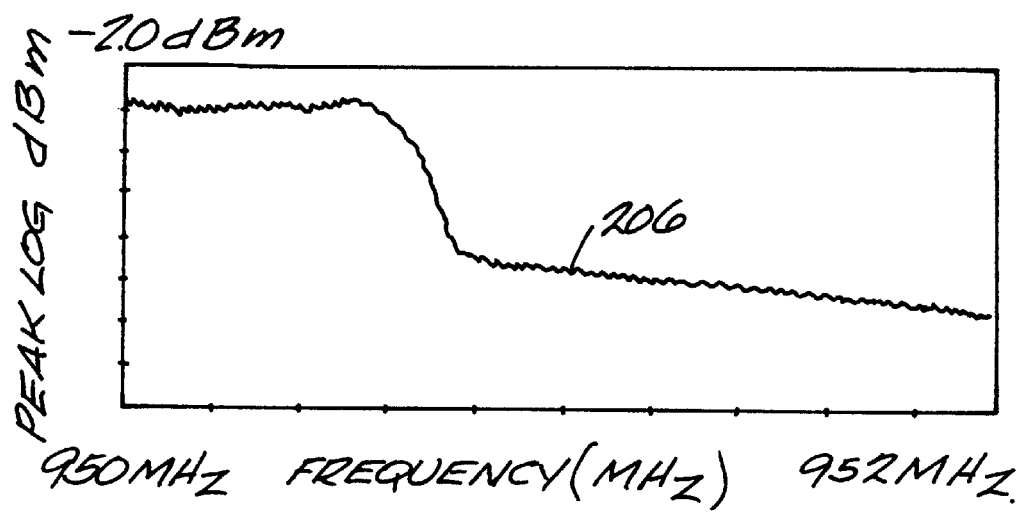
FIG. 4 is a spectral analysis graph of power versus frequency for an FFA operating near a regrowth specification limit for CDMA communications.
Figure 5:
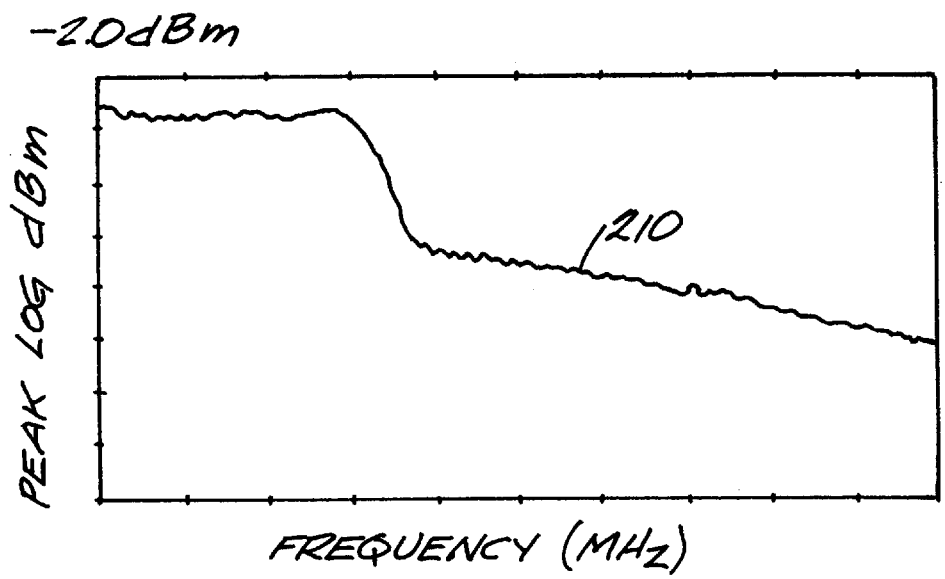
FIG. 5 is a spectral analysis graph of power versus frequency for an FFA operating near a regrowth specification limit for CDMA communications where the FFA has been set to have an increased power output.
Figure 6:
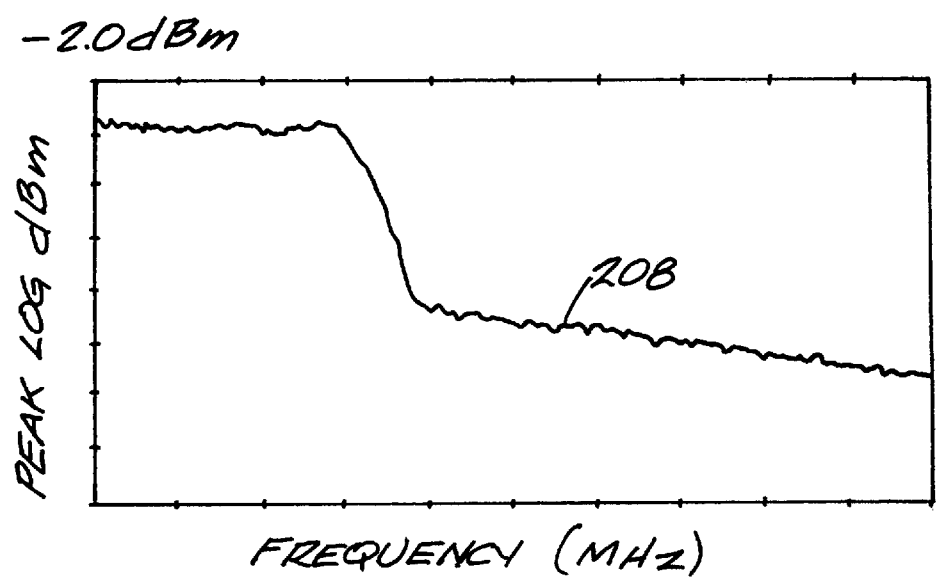
FIG. 6 is a spectral analysis graph of power versus frequency for an FFA operating near a regrowth specification limit for CDMA communications where the FFA has been set to have improved spectral regrowth.

FIGS. 4 and 6 show the spectral analysis of an FFA. The FFA was constructed out of the same or similar components of those used in the BEC amplifier 50, except that a 10 dB pad was coupled to the output of the error-canceling amplifier to simulate a 10 dB coupler, and the reference level was set at −2 dB to compensate for losses at the output summer (−1 dB for an FFA versus +3 dB for a BEC amplifier in a typical configuration). FIGS. 4 and 6 illustrate traces 206 and 208, respectively, of an FFA set up to provide a spectral regrowth that is similar to that exhibited by the trace 200. A comparison of the traces 206 and 208 to the trace 202 illustrates that the BEC amplifier provides about 2 to 3 dB more power than the FFA for the same or similar regrowth. FIG. 5 illustrates a trace 210 of an FFA designed to have approximately the same output power of a BEC amplifier. A comparison of the trace 202 and the trace 210 illustrates that when the FFA is configured to provide the same or similar output power of a BEC amplifier, its spectral regrowth is higher than that produced by a BEC amplifier.

As can be seen from the above, the present invention provides an efficient, linear amplifier that has higher power output and lower spectral regrowth than many known amplifiers. Various features and advantages of the invention are set forth in the following claims.

What is claimed is:

1. An error correction amplifier for amplifying a main signal, the amplifier comprising:
   a main amplifier operable to receive the main signal and generate an amplified signal having a main component and an error component;
   a second amplifier coupled in a feed-forward arrangement to the main amplifier and operable to receive an input signal that includes a plurality of components and to generate an output signal having a main component and an error component;
   a balancing network coupled to the main amplifier and to the second amplifier, the balancing network operable to isolate a sample of the amplified signal containing both the main component and the error component, invert the sample, gain and phase adjust one of the components of the input signal, and combine the sample with the gain and phase adjusted component of the input signal to the second amplifier; and
   a summing point where the amplified signal from the main amplifier and the output signal of the second amplifier are combined such that the error components of the amplified signal and the output signal substantially cancel one another and the main components of the amplified signal and the output signal are added to one another.

2. An amplifier as claimed in claim 1, wherein the main amplifier has a gain and the second amplifier has a gain that is substantially the same as the gain of the main amplifier.

3. An amplifier as claimed in claim 1, wherein the balancing network includes at least one gain control component and at least one phase control component.

4. An amplifier as claimed in claim 1, wherein the error-correction amplifier has an input node and a first path, which extends from the input node, through balancing network to the second amplifier to the summing point, and is matched in phase and gain to a second path, which extends from the input node to the balancing network to the main amplifier to the summing point.

5. An amplifier as claimed in claim 1, wherein a third path, which extends from the output of the main amplifier to the balancing network to the second amplifier to the summing point, is higher in gain than and is 180° out-of-phase from a fourth path, which extends from the output of the main amplifier to the summing point.

6. An amplifier as claimed in claim 1, wherein a fifth path, which extends from the balancing network to the second amplifier, is higher in gain than and 180° out-of-phase from a sixth path, which extends from the balancing network to the main amplifier back to the balancing network and to the second amplifier.

7. An error correction amplifier comprising
   an input node,
   a main amplifier coupled to the input node, the main amplifier operable to generate an amplified signal having a main component and an error component;
   a first gain and phase control assembly coupled to the input node;
   a second gain and phase control assembly coupled to the main amplifier;
   a first combiner coupled to the first gain and phase control assembly and to the second gain and phase control assembly;
   a second amplifier coupled to the first combiner; and
   a second combiner coupled to the second amplifier and the main amplifier.

8. An amplifier as claimed in claim 7, wherein the main amplifier has a gain and the second amplifier has a gain that is substantially the same as the gain of the main amplifier.

9. An amplifier as claimed in claim 7, wherein the main amplifier is adjusted to provide an output signal three times the amplitude of a signal input to the first gain and phase control assembly.

10. An amplifier as claimed in claim 7, wherein the second gain and phase control assembly is adjusted to produce a signal 180° out-of-phase from the output signal of the first gain and phase control assembly.

11. An amplifier as claimed in claim 7, wherein the second gain and phase control assembly includes a gain control amplifier that has a gain that is two times the inverse of the gain of the main amplifier.

12. An amplifier as claimed in claim 7, wherein the first combiner produces an output that is equal to the sum of two input signals.

13. A method of removing distortion from an amplified signal, the method comprising:
   providing a first signal path with a gain and a phase;
   providing a second signal path that is 180° out-of-phase from the first signal path and that has a gain that is about two times greater than the gain of the first signal path;
   providing a third signal path with a gain and a phase; and
   providing a fourth signal path that has a gain and phase that are substantially the same as the gain and phase of the third signal path.

14. A method as claimed in claim 13, further comprising:
   providing an input node;
   providing an output node; and
   providing a balancing network.

15. A method as claimed in claim 14, wherein the second signal path provides a negative distortion-canceling signal.

16. A method as claimed in claim 14, wherein the third and fourth signal paths are matched in phase and gain to achieve maximum vector addition.

17. A method as claimed in claim 13, further comprising;
   providing a fifth signal path having a gain and a phase; and providing a sixth path that is 180° out-of-phase from the fifth signal path and that has a gain of about 1.5 times the gain of the fifth signal path.

18. An amplifier comprising:
an input node;
an output node;
a balancing network;
a main amplifier;
a distortion-canceling amplifier;
a first signal path that runs from the input node to the balancing network to the distortion-canceling amplifier to the output node;
a second signal path that runs from the input node to the balancing network to the main amplifier to the output node;
a third signal path that runs from the output of the main amplifier to the balancing network to the distortion-canceling amplifier to the output node;
a fourth signal path that runs from the output of the main amplifier to the output node;
a fifth signal path that runs from the input node to the balancing network to the distortion-canceling amplifier; and
a sixth signal path that runs from the input node to the main amplifier to the balancing network to the distortion-canceling amplifier and has a gain and a phase such that the fifth signal path has a phase that is 180° different than the phase of the sixth signal path and a gain of about 1.5 times the gain of the sixth signal path.

19. An amplifier as claimed in claim 18, wherein the fourth signal path has a gain and a phase, and the third signal path has a phase that is 180° different than the phase of the fourth signal path and the third signal path has a gain that is about two times greater than the gain of the fourth signal path.

20. An amplifier as claimed in claim 18, wherein the first signal path has a gain and a phase, and the second signal path has a gain and a phase that are substantially the same as the gain and phase of the first signal path.

21. An amplifier that sums equal-phase output signals from two amplifiers to obtain an output, the amplifier comprising:
a main amplifier that produces an output signal having a main component and an error component;
a distortion-canceling amplifier that generates an output signal having a main component and an error component that cancels the distortion produced by both amplifiers;
a balancing network having a gain and phase assembly and coupled to the main and distortion-canceling amplifiers such that the error signals produced by the main and distortion-canceling amplifiers are substantially the same; and
a combiner coupled to the main amplifier and the distortion-canceling amplifier such that main components of output signals are added together to create an increased power signal and the error components are canceled.

22. An amplifier as claimed in claim 21, wherein the main amplifier has a gain and the second amplifier has a gain that is substantially the same as the gain of the main amplifier.

23. An amplifier as claimed in claim 21, wherein the balancing network includes at least one gain control component and at least one phase control component.

24. An amplifier as claimed in claim 21, furthering comprising an input; and a first path, which extends from the input to the balancing network to the second amplifier to a summing point, the first path matched in phase and gain to a second path, which extends from the input to the balancing network to the main amplifier to the summing point.

25. An amplifier as claimed in claim 21, wherein a third path, which extends from the output of the main amplifier to the balancing network to the second amplifier to a summing point, is higher in gain than and is 180° out-of-phase from a fourth path, which extends from the output of the main amplifier to the summing point.

26. A method of amplifying a signal, the method comprising:
dividing an input signal into a first component and a second component;
adjusting the phase and gain of the second component;
amplifying the first component of the input signal to create an output signal;
sampling the output signal to create a sampled signal;
combining the sampled signal and the second component of the input signal to create a combined signal;
amplifying the combined signal to create a correction signal; and
combining the output signal and the correction signal to create an amplified signal.

27. A method as claimed in claim 26, wherein the first component is amplified by a first gain and the combined signal is amplified by a second gain that is substantially equal to the first gain.

28. A method as claimed in claim 26, wherein the output signal includes an error component and the correction signal includes an error component, the act of combining the output signal and the correction signal further comprising canceling the error components of the output and correction signals.

29. A method as claimed in claim 26, further comprising balancing the amplitudes of the combined signal and the first component.

30. A method as claimed in claim 26, further comprising adjusting the phase and gain of the sampled signal.

31. An error correction amplifier for amplifying a main signal, the amplifier comprising:
an input node;
a first coupler coupled to the input node and having a coupling coefficient of about 12 dB;
a main amplifier coupled to the first coupler and to generate an amplified signal having a main component and a noise component;
a sampling coupler coupled to the main amplifier to divert a part of the amplified signal to a feed-forward path having a gain and phase control mechanism, the sampling coupler having a coefficient proportional to the inverse of the gain of the main amplifier;
a second gain and phase control mechanism coupled to the first coupler;
a 3dB combiner to combine the signal from the first and second gain and phase control mechanisms;
an error amplifier coupled to the 3dB combiner; and
a second coupler coupled to the error amplifier and the sampling coupler.

* * * * *